United States Patent [19]

Kashio

[11] 4,193,038

[45] Mar. 11, 1980

[54] KEY INPUT APPARATUS

[75] Inventor: Toshio Kashio, Tokyo, Japan

[73] Assignee: Casio Computer Co., Ltd., Tokyo, Japan

[21] Appl. No.: 892,177

[22] Filed: Mar. 31, 1978

[30] Foreign Application Priority Data

Apr. 11, 1977 [JP] Japan ................................ 52/41100

[51] Int. Cl.[2] ........................ G10H 1/00; H03K 19/24

[52] U.S. Cl. ...................................... 328/104; 328/61; 328/154; 307/243; 84/1.01; 84/1.03; 84/1.17

[58] Field of Search ...................... 84/1.01, 1.03, 1.11, 84/1.17, 1.19, 1.08; 328/104, 154, 61; 307/243

[56] References Cited

U.S. PATENT DOCUMENTS

| | | | |
|---|---|---|---|
| 3,657,658 | 4/1972 | Kubo | 328/104 X |
| 3,803,497 | 4/1974 | Tyau | 307/243 X |
| 3,991,645 | 11/1976 | Luce et al. | 84/1.01 |
| 4,007,358 | 2/1977 | Iguchi et al. | 328/104 |
| 4,108,036 | 8/1978 | Slaymaker | 84/1.01 |

*Primary Examiner*—John S. Heyman

*Attorney, Agent, or Firm*—Frishauf, Holtz, Goodman and Woodward

[57] ABSTRACT

A key input apparatus is provided with a plurality of input operation keys and a time signal generating circuit which in correspondence to the number of these input keys performs a step operation to generate in turn a different timing signal. Input signals produced by actuation of the input operation keys pass through a group of first AND gates in synchronism with the corresponding timing signals generated from the timing signal generating circuit. A shift register having bits corresponding in number to the gates of the group of first AND gates receives the output signal of the AND gates via an OR gate. The output signal from the OR gate is applied to one input terminal of a second AND gate of which the other input terminal is coupled with the last bit position of the shift register through an inverter. The outputting operation of the second AND gate is controlled by the shift register and inverter. The respective signals due to the actuation of the input keys are produced in synchronism with the corresponding timing signals from the timing signal generating circuit.

1 Claim, 18 Drawing Figures

KEY INPUT APPARATUS

BACKGROUND OF THE INVENTION

The invention relates to a key input apparatus capable of detecting input signals due to the actuation of a single key or the simultaneous actuation of a plurality of keys.

Generally, the key input apparatus is provided with a plurality of input operation keys and applied to various electronic apparatuses such as electronic computers and electronic musical instruments. A key matrix is devised in order to reduce the number of terminals of an integrated circuit of the key input apparatus when input signals produced by the key actuations are inputted to the electronic apparatuses. In this matrix construction, when a plurality of keys are simultaneously actuated, the called branching-out currents flow into current paths among the actuated keys, resulting frequently in erroneous operation. It is for this reason that diodes are provided at the cross points of the matrix which provide current branch paths. The provision of the diodes are defective in that, when the number of the keys is large as in the case of the musical instruments, the mounting work of diodes is troublesome and the reliability of the apparatus is deteriorated.

SUMMARY OF THE INVENTION

Accordingly, an object of the invention is to provide a key input apparatus which is so constructed that a plurality of keys are each used as an independent output terminal, the keys being not arranged in matrix form, and which eliminates the need of providing additional components such as diodes and structually permits no occurrence of the current sneak.

To achieve the above object, there is provided a key input apparatus comprising: a plurality of input keys which are manually operated; a group of first AND gates corresponding in number to said input keys, each of said first AND gates having first and second input terminals; first connecting means for connecting the respective output terminal of said input keys corresponding to the first input terminals of said first AND circuits; a timing signal generating circuit which has output terminals corresponding to the number of said AND gates and produces successively different timing signals for successively scanning said first AND gates; second connecting means for connecting the output terminals with the corresponding second input terminals of said first AND gates; and OR gate for logically summiing the output signals from said first AND gates; a shift register which has bits corresponding in number to said first AND gates and receives the key input signals due to key depressions via said OR gate to successively shift them toward the output side of the shift register; an inverting circuit which is connected to the output side of said shift register to invert an output signal from the final bit position of said shift register; and a second AND gate for obtaining a logical product of the outputs of said inverting circuit and said OR gate, thereby producing the key input signals from said input keys depressed.

With such a construction, the key input device eliminates the need of the matrix construction which is necessary for the conventional one and permits the portion except the keys to be constructed by using LSI. Even in the single actuation or simultaneous actuation by a plurality of input keys, a single output is surely and successively detected every one actuation of the input key without being influenced by other keys.

Particularly in the case of applying the invention to an electronic musical instrument, the invention provides a prominent effect in detecting input signals of individual input keys at the time of conducting a chord performance by simultaneous operation of a plurality of keys.

Other objects and features of the invention will be apparent from the following description taken in connection with the accompanying drawings, in which:

DETAILED DESCRIPTION OF THE PREFERRED EMBODIMENTS

An examplary embodiment of the invention will be elaborated with reference to the drawings. It should be expressly understood that the invention may be applied for any type of electronic apparatuses with input operation keys such as electronic calculators. For easy of explanation, however, the embodiment to follow is a key input apparatus with 84 input operation keys such as a keyboard of a pianoforte.

Figure 1:
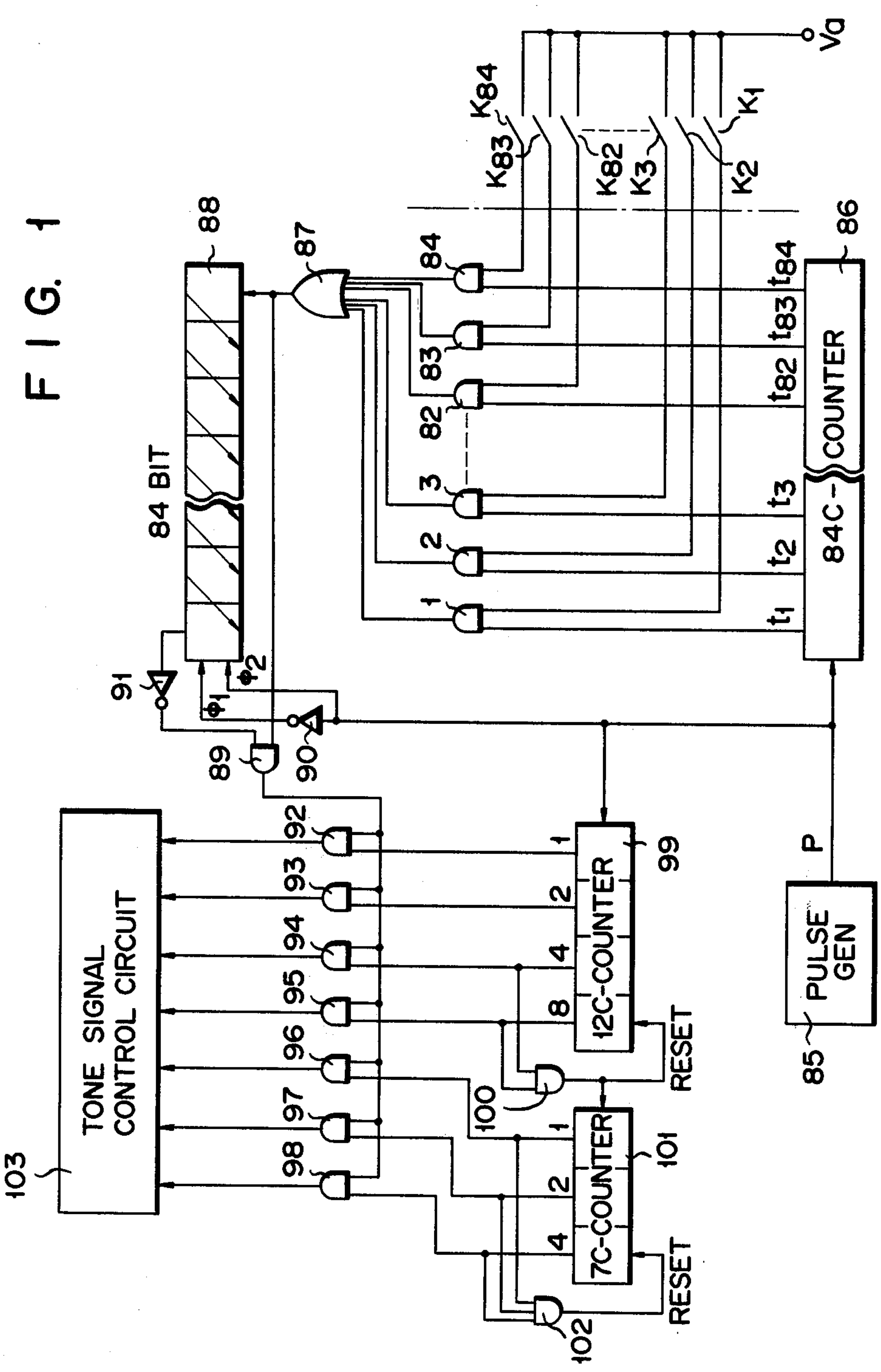
FIG. 1 shows a block and schematic diagram of an embodiment of a key input apparatus according to the invention.
Figures 2A, 2B, 2C, 2D, 2E, 2F, 2G, 2H, 2I, 2J, 2K, 2L, 2M, 2N, 2O, 2P:
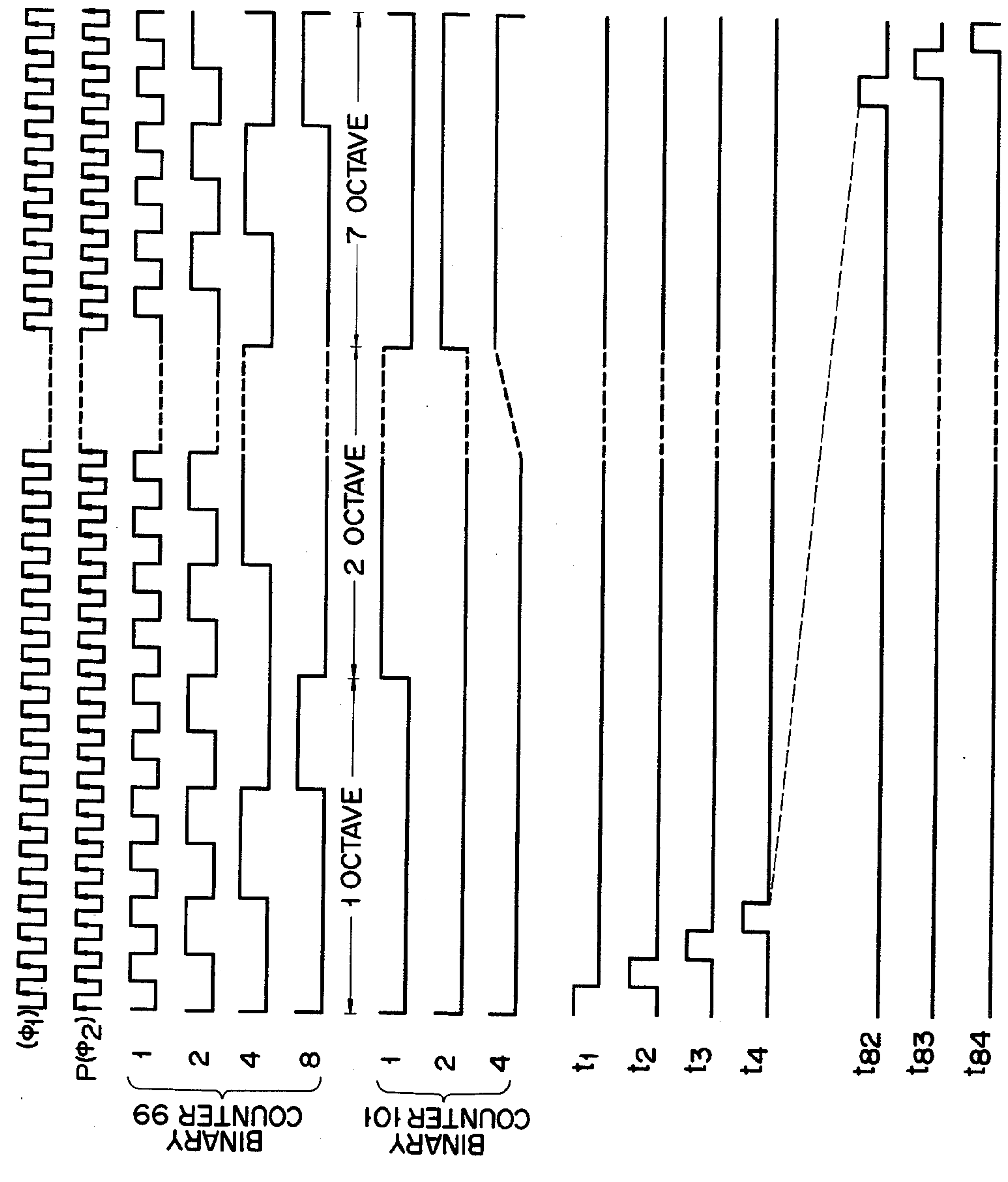
FIG. 2 shows a set of timing diagrams useful in illustrating the operation of the circuit of FIG. 1.

In FIG. 1, 84 input operation keys $K_1$, $K_2$ . . . $K_{84}$ are connected at one ends to a given potential Va and at the other ends to one input terminals of AND circuits 1, 2 . . . 84. The other input terminals of these AND gates are connected to output terminals of a scale-of-84 counter 86 serving as a timing signal generating circuit. The counter 86 has 84 steps corresponding to the number of input operation keys. Receiving a clock signal P with a fixed period (FIG. 2B), the counter 86 circulatively counts the clock signal to produce a series of step outputs as scanning signals $t_1$ to $t_{84}$ (FIG. 2(J) to FIG. 2(P)). The outputs of the AND gates 1 and 84 are coupled with an OR gate 87 which is further coupled at the output to the first big position of a shift register 88 and to one input terminal of an AND gate 89. The AND gate 89 produces a signal corresponding to the key pressed. The shift register 88 and an inverter 91 connected to the last bit position intervenes between the output of the AND gate 87 and the other input terminal of the AND gate 89, in order that the AND gate 89 produces one output signal in response to the actuation of one of the keys. The shift register 88 has a memory capacity of 84 bits corresponding to the AND gates 1 to 84 and the stored data is shifted by being applied to a clock pulse P from the clock pulse generator 85 as a write-in pulse $0_1$ and as a read-out pulse $0_2$ inverted from the clock signal P through the inverter 90. The output signal of the OR circuit 87 shifts by 84 bits through the shift register 88 in synchronism with the write-in pulse $0_1$ and the read-out pulse $0_2$. The output signal leaving the shift register 88 is inverted by the inverter 91 to disable the AND gate 89 thereby to prevent the output signal coming directly from the OR gate 87 from passing through the AND gate 89. In this manner, the output signal of an identical key operation is outputted from the AND gate 89 in the form of one pulse every 84 bits. The output signal of the AND gate 89 is successively applied to a tone signal control circuit 103, through AND gates 92 to 98 connected in parallel. The AND gates 92 to 95 are connected at the other input terminals to the bit output terminals of a scale-of-12 counter with a 4 bit construction corresponding to 12 scales. The counter 99 counts the clock signal P from the clock signal generator 85 in synchronism with the drive operation of the counter 86 and the shift register 88. The output signals from the third and fourth bits of the binary counter 99 are coupled with an AND gate 100. When the counter 99 counts 12, it is detected by the AND gate 100 and the counter 99 is immediately reset. See FIGS. 2(C) to (F). The output signal of the AND gate 100 is applied as a counting signal to a scale-of-7 counter 101. The binary counter 101 performs in 7 scale mode the counting operating corresponding to 7 octaves, with one step count for one octave including 12 scales. See FIGS. 2(G) to (H). The respective bit outputs of the counter 101 are coupled with an AND circuit 102. When the AND circuit 102 detects count "7", the counter 101 is reset. In this way, the counter 99 counting the clock pulse P provides bit signals corresponding to 12 scales to the one input terminals of the AND gates 92 to 95. The counter 101 provides bit signals each for one octave to one gate terminals of the AND gates 96 to 98. With such a circuit connection, when the input keys are pressed, the scale signal and octave signal corresponding to the key pressed in synchronism with the scanning signals $t_1$ to $t_8$ which are step outputs of the counter 86 are applied from the AND circuit 89 to the tone signal control circuit 103.

The explanation to be given is the operation of the key input apparatus when the second key $K_2$ is depressed.

When the key $K_2$ is depressed, an operation signal produced is applied to one input terminal of the AND gate 2. Under this condition, applied from the counter 86, the scanning signal $t_2$ enables the AND gate 2 to permit the operation signal to pass therethrough. The operation signal leaving the AND gate 2 passes through the OR gate 87 to reach the shift register 88 and the one input terminal of the AND gate 89. At this time, no input signal reaches the last bit position of the shift register 88 and a logical level "1" from the inverter 91 reaches the other input terminal of the AND gate 89. In this time, the AND gate 89 is enabled to permit the operation signal to pass therethrough as the corresponding scanning signal $t_1$ (FIG. 2(*k*)). On the other hand, at this time, code signals 0000001 representing count values of the binary counters 99 and 101 are applied to the one input terminals of the AND gates 92 to 98, respectively. Therefore, the operation signal from the AND gate 89 passes through the AND gates 92 to 98 to the respective inputs of the tone signal control circuit 103. The counter 86 continues its recirculating counting operation. If the key $K_2$ is still depressed, at the time the ensuing scanning signal $t_2$ occurs, the signal $t_2$ reaches again the AND circuit 89. However, at this time, the scanning signal $t_2$ of the preceeding cycle reaches the last bit position of the shift register 88 and is outputted therefrom. Accordingly, the output of the inverter 91 is a logical level "0". This disables the AND gate 89 thereby to block the passing of the scanning signal $t_2$ produced later. In this way, one time operation of the input key $K_2$ permits only one scanning signal $t_2$ to pass through the AND gate 89 at the first cycle. This operation is correspondingly applied to the operations of the other keys. This is tabulated in the following table. In the table, symbol "0" designates a occurrence of the scanning signal in the first cycle, and symbol "x" non-occurrence of an identical signal in the second cycle.

Table

| Keys | Signals corre. to Keys | 1st Cycle | 2nd Cycle |
|---|---|---|---|
| | | $t_1$ $t_2$ $t_3$ $t_4$ $t_5$ $t_6$ ... $t_{82}$ $t_{83}$ $t_{84}$ | $t_1$ $t_2$ $t_3$ $t_4$ $t_5$ $t_6$ ... $t_{82}$ $t_{83}$ $t_{84}$ |
| $K_1$ | $t_1$ | o ———— | x ———— |
| $K_2$ | $t_2$ | — o ———— | — x ———— |
| $K_3$ | $t_3$ | —— o ———— | —— x ———— |
| $K_4$ | $t_4$ | ——— o ———— | ——— x ———— |
| $K_5$ | $t_5$ | ———— o ———— | ———— x ———— |
| $K_6$ | $t_6$ | ————— o ———— | ————— x ———— |
| ⋮ | ⋮ | ........................ | ........................ |
| $K_{82}$ | $t_{82}$ | ———————— o —— | ———————— x —— |
| $K_{83}$ | $t_{83}$ | ————————— o — | ————————— x — |
| $K_{84}$ | $t_{84}$ | —————————— o | —————————— x |

As seen from the table, when a plurality of keys $K_4$, $K_5$, $K_{82}$, and $K_{83}$, or example, are simultaneously depressed, key input signals successively pass through the AND gate 89 in synchronism with the scanning signals $t_4$, $t_5$, $t_{82}$ and $t_{83}$. As a result, the key code data from the scale-of-12 and scale-of-7 counters 99 and 101 at the time of occurrence of the scanning signals are successively applied to the tone signal control circuit 103 through the AND gates 92 to 98. Even in this simultaneous depression of the keys, the scanning signals $t_4$, $t_5$, $t_{82}$ and $t_{83}$ in the first cycle are applied to the shift register 88 and these are coincidently outputted from the same when these scanning signals occur in the next cycle. For this reason, the AND gate 89 is disabled to block the pass of the later coming scanning signals.

Figure 3:
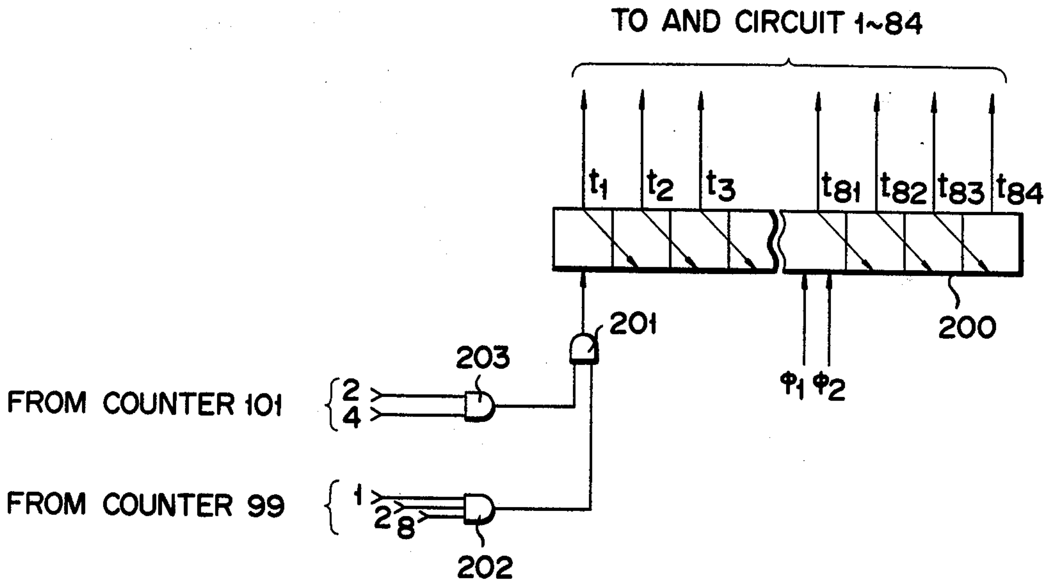
FIG. 3 shows one embodiment of the timing signal generating circuit of this invention.

Alternately, the timing signal generating circuit may also be constructed as shown in FIG. 3. A shift register 200 of 84 bits is provided having an AND gate 201 at the input. The AND gate 201 is connected at one input to an AND gate 202 and at the other input to an AND gate 203. The weighted output signals "1", "2" and "8" from the counter 99 in FIG. 1 are applied to the inputs of the AND gate 201. The weighted output signals "2" and "4" from the same are applied to the inputs of the AND gate 203. With provision of such a circuit construction, the 84 scales of the counters 99 and 101 may surely be synchronized with the 84 scales of the shift register 200.

Accordingly, the invention is effective for detecting the individual keys depressed when chord is produced by simultaneously depressing a plurality of keys. Notable that the circuit construction is simple. There is a possibility that the number of the input terminals of a LSI package in the invention may be larger than that of the case of the conventional key matrix system. However, in the conventional key matrix system, diodes must be used corresponding to the number of the keys. This is defective particularly for musical instruments because these need a large number of diodes corresponding the number of keys. Accordingly, the assembling work is troublesome with poor reliability of the apparatus. On the other hand, the invention permits other portions than the keys to be formed by using the LSI package without any additional components such as diodes. The invention also solves the problems arising from the simultaneous key depression. The larger the number of the input keys is, the larger the size of the apparatus is. The size of the LSI package is not restricted as in the small-sized apparatus. Therefore, the number of the terminals of the LSI package is freely set up even when the input key number is large. Thus, the circuit construction capable of detecting individually the key operated signals in the simultaneous depression of the keys is effectively applicable with the output lines scheme allotted individually for the input keys.

Incidentally, the keys $K_1$ to $K_{84}$ may be push button switches, touch switches, pressure sensitive switches, and the like.

What is claimed is:

1. A key input apparatus comprising:

a plurality of input keys which are manually operated;

a group of first AND gates corresponding in number to said input keys, each of said first AND gates having first and second input terminals;

first connecting means for connecting the respective output terminal of said input keys corresponding to the first input terminals of said first AND circuits;

a timing signal generating circuit which has output terminals corresponding to the number of said AND gates and produces successively different timing signals for successively scanning said first AND gates;

second connecting means for connecting the output terminals with the corresponding second input terminals of said first AND gates;

an OR gate for logically summing the output signals from said first AND gates;

a shift register which has bits corresponding in number to said first AND gates and receives the key input signals due to key depressions via said OR gate to successively shift them toward the output side of said shift register;

an inverting circuit which is connected to the output side of said shift register to invert an output signal from the final bit position of said shift register; and a second AND gate for obtaining a logical product of the outputs of said inverting circuit and said OR gate, thereby producing the key input signals from said input keys depressed.

* * * * *